United States Patent [19]

Halavee et al.

[11] Patent Number: 4,941,980

[45] Date of Patent: Jul. 17, 1990

[54] SYSTEM FOR MEASURING A TOPOGRAPHICAL FEATURE ON A SPECIMEN

[75] Inventors: Uriel Halavee, Ramat Gan; Israel Niv, Shdema; Tzila Schwarzkopf, Tel Aviv, all of Israel

[73] Assignee: Opal, Inc., Santa Clara, Calif.

[21] Appl. No.: 312,619

[22] Filed: Feb. 17, 1989

[51] Int. Cl.$^5$ .............................................. H01J 37/28
[52] U.S. Cl. .................................... 250/310; 250/307; 250/397
[58] Field of Search ......................... 250/310, 307, 397

[56] References Cited

U.S. PATENT DOCUMENTS

| | | | |
|---|---|---|---|
| 3,329,813 | 7/1967 | Hashimoto | 250/310 |
| 3,920,990 | 11/1975 | Van Nieuwland et al. | 250/309 |
| 4,177,379 | 12/1979 | Fuukawa et al. | 250/306 |
| 4,217,495 | 8/1980 | robinson | 250/310 |
| 4,219,731 | 8/1980 | Migitaka et al. | 250/310 |
| 4,308,457 | 12/1981 | Reimer | 250/310 |
| 4,535,249 | 8/1985 | Reeds | 250/491.1 |
| 4,588,890 | 5/1986 | Finnes | 250/310 |
| 4,600,839 | 7/1986 | Ichihashi et al. | 250/310 |

FOREIGN PATENT DOCUMENTS

0186851A2  9/1986  European Pat. Off.

OTHER PUBLICATIONS

Postek and Joy, "Submicrometer microelectronics dimensional metrology scanning electron microscopy", J. Res. of the NBS, 1987, 92(3), 205–228.

T. Ahmed et al., "Low voltage SEM metrology for pilot line application,"SPIE, 1987, 775, 80–88.

P. W. Grant, "Use of scanning electron microscope for critical dimension measurement on a semiconductor production line", SPIE, 1985, 565, 169–172.

G. Matsuoka et al., "Automatic electron beam metrology system", J. Vac. Sci. Tech. B., 1987, 5, 79–83.

Primary Examiner—Jack I. Berman
Attorney, Agent, or Firm—Darby & Darby

[57] ABSTRACT

A system for measuring a topographical feature on a specimen including apparatus for scanning an electron beam across the feature at high speed, first and second electron detector apparatus organized in pairs, apparatus for signal processing of a first signal received from the first electron detector apparatus thereby to identify elements of a cross-sectional profile of the feature, apparatus for signal processing of a second signal received from the second electron detector apparatus generally separately from the signal processing of the first signal thereby to identify elements of a cross-sectional profile of the feature, and apparatus for incorporating the elements identified from the first electron detector apparatus and the elements identified from the second electron detector apparatus thereby to produce a composite picture of the feature.

12 Claims, 6 Drawing Sheets

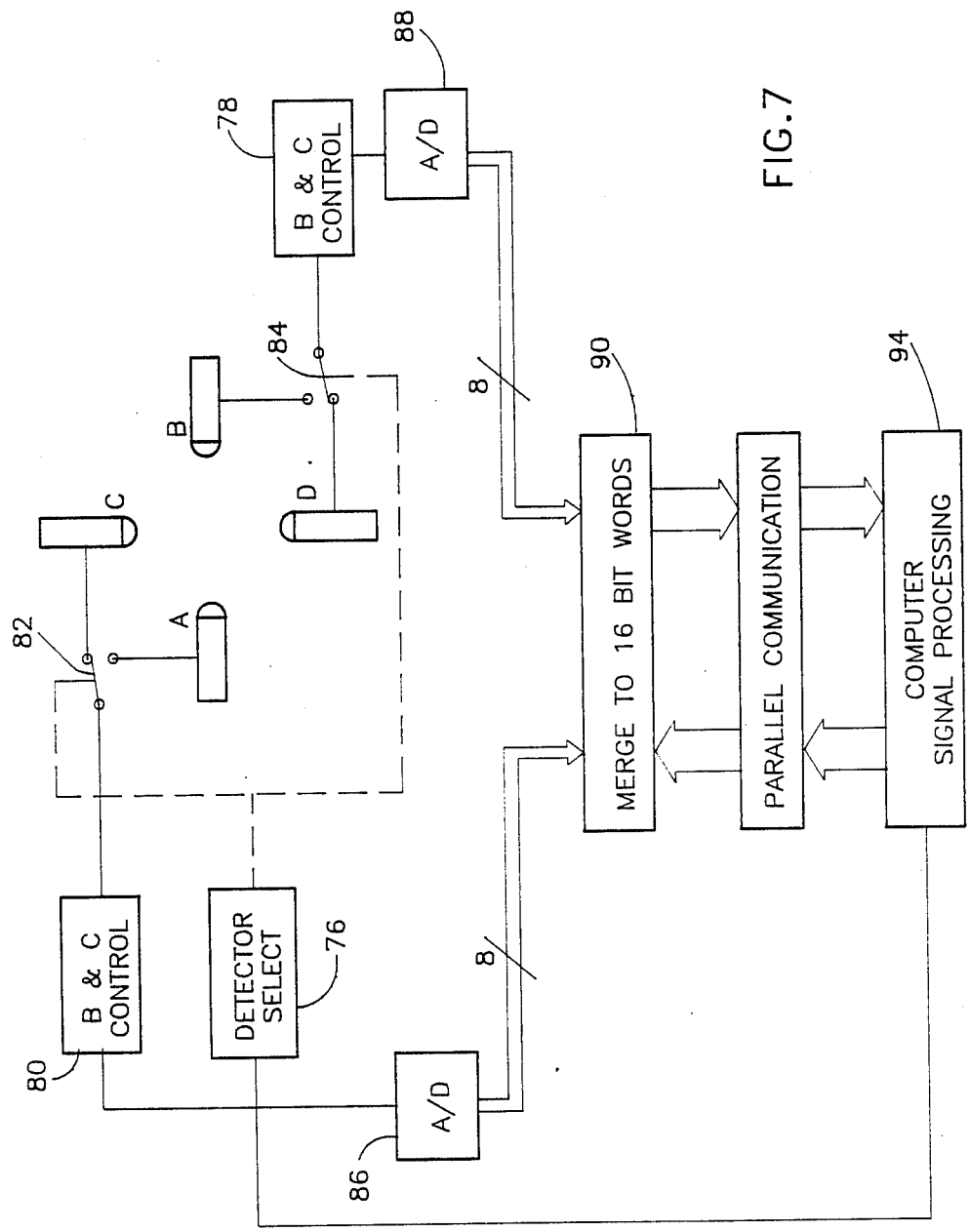

SYSTEM FOR MEASURING A TOPOGRAPHICAL FEATURE ON A SPECIMEN

FIELD OF THE INVENTION

The present invention relates generally to scanning electron beam measurement equipment and specifically to automated in-process scanning electron beam measurement equipment for measuring semi-conductor wafer features.

BACKGROUND OF THE INVENTION

Various method for measuring the size, shape and accuracy of placement of semi-conductor features, while they are still in the form of wafers of silicon are known in the art. Electron-beam imaging has been established as the technology of choice for process development and off-line quality assurance applications, as discussed in the following articles:

M. T. Postek and C. C. Joy, "Submicrometer microlectronics dimensional metrology: scanning electron microscopy," J. of Research of NBS, Vol 92(3), 205–228, 1987.

T. Ahmed, S. R. Chen, H. M. Naguib, T. A. Brunner and S. M. Stuber, "Low voltage SEM metrology for pilot line application," SPIE 775, 80–88, 1987.

As integrated circuits are fabricated with feature geometries measuring a micron or less, high resolution measurements of device features on wafers must be made inprocess, as discussed in the article, "Use of scanning electron microscope for critical dimension measurements on a semiconductor production line," P. W. Grant, SPIE 565, 169–172, 1985.

It is known in the art that sample charging may dramatically distort the line width measurement of non-conducting materials, and that the line width measurement is very senstive to lack of focus. Both effects impair the ability to measure line width automatically. It is also known in the art that any line width in the micron or submicron range, such as resist line width, cannot be expressed as a single value, but must be described by at least two important points along the line, such as the location of both the bottom and top of the resist line.

U.S. Pat. No. 4,588,890 discloses an apparatus and method for composite image formation using a scanning electron beam which employs two oppositely disposed electron detectors to detect secondary electrons emitted from a planar specimen surface after it is radiated with a primary electron beam. As the primary electron beam is scanned across a topographical feature on the specimen surface, the electron detectors are alternately switched on and off to produce first and second electric signals which are then combined to produce a composite electric signal. The signal provides an enhanced symmetrical image of the junctures of the planar surface with the opposite lower edges of the topographical feature.

To attract secondary electrons, the electron detectors are charged with a predetermined amount of voltage, which causes a deflection of the primary electron beam towards an electron detector which is currently operative. By alternately switching the pair of electron detectors on and off, the primary electron beam does not maintain a constant position, thus introducing a possible source of inaccuracy in the resulting measurements.

Another possible source of inaccuracy stems from requiring two scans per measurement. Since measurement systems invariably vibrate and since the precision requirements are in the tens of nanometers range, vibrations occurring during the two scans of a measurement will introduce significant errors.

Additionally, the invention disclosed in U.S. Pat. No. 4,588,890 only measures the junctures of a feature with the planar surface of a speciment.

G. Matsuoka et al, in "Automatic electron beam metrology system for development of very large-scale integrated devices," Journal of Vacuum Science Technology, B5(1), p. 79–83, 1987, disclose a system which uses a low voltage electron beam, a precise X-Y stage for positioning a specimen, and four electron detectors placed at the 90° points around a circle. The system collects data from all four detectors during a scan of the primary electron beam and combines them as follows: a sum of all four signals ($X^+$, $X^-$, $Y^+$, and $Y^-$), a left-side signal ($X^+ + Y^+ + Y^-$), and a right-side signal (($X^- + Y^+ + Y^-$). The three signals are then differentiated and a max-detection process of the larger value of the left- and right-side signals, at each point, also occurs.

The system described by G. Matsuoka et al has a few drawbacks. First, topographical information contained in each signal is potentially lost in the max-detection process. Additionally, inaccuracies due to vibrations of the X-Y stage can occur during a scan of the primary beam if the scan speed is slower than the vibration speed.

SUMMARY OF THE INVENTION

The present invention seeks to provide a precise measurement system for topographical features, in the micron and submicron ranges, of a specimen. The system should maintain constant primary beam deflection, detect secondary electrons during one primary beam scan, and identify many elements of the cross-sectional profile of a feature. The system should also scan the specimen quickly in order to reduce measurement errors due to vibrations.

There is thus provided in accordance with a preferred embodiment of the present invention a system for measuring a topographical feature on a specimen including apparatus for scanning an electron beam across the feature at high speed, first and second electron detector apparatus organized in pairs, apparatus for signal processing of a first signal received from the first electron detector apparatus thereby to identify elements of a cross-sectional profile of the feature, apparatus for signal processing of a second signal received from the second electron detector apparatus generally separately from the signal processing of the first signal thereby to identify elements of a cross-sectional profile of the feature, and apparatus for incorporating the elements identified from the first electron detector apparatus and the elements identified from the second electron detector apparatus thereby to produce a composite picture of the feature.

Additionally, in accordance with a preferred embodiment of the present invention the scanning apparatus scans the specimen, only in the area around the feature and scans the feature a predetermined number of times.

Further, according to a preferred embodiment of the invention, the first and second electron detector apparatus are organized into two detector pairs and of the two detector pairs, only one pair is operative during the predetermined number of scans. The operative pair of electron detectors detects electrons simultaneously during a single scan while not additionally deflecting the primary electron beam.

Still further, according to a preferred embodiment of the invention, the apparatus for signal processing includes a signal processing method including the steps of filtering noisy signals received from each electron detector of the operative electron detector pair during the fast scan of the electron beam thereby to smooth the signal and to enhance contrasts, centering the noisy signals by generally detecting the center location of the topographical feature, summing together the predetermined number of the centered noisy signals from the first electron detector, summing together the predetermined number of the centered noisy signals from the second electron detector, twice repeating the filtering step on the results of the summing steps and detecting significant features of the topographical feature from the result of the repeating step.

Alternatively, the steps of filtering the noisy signals and of centering them are optional and the step of summing occurs for uncentered noisy signals.

Further, according to a preferred embodiment of the present invention dimensional quantities of the topographical feature, or features, are calculated from the significant features extracted, via the signal processing method, from the signals received from the first and second electron detectors of the detector pair.

Finally, according to a preferred embodiment of the present invention, the dimensional quantities computer can identify the top, middle and bottom of a resist line. It can also automatically identify if the topographical feature is a protrusion or is recessed into the specimen.

BRIEF DESCRIPTION OF THE DRAWINGS

The present invention will be understood and appreciated more fully from the following detailed description, taken in conjunction with the drawings in which:

FIG. 7 is a schematic illustration of the data flow of the apparatus of FIG. 1.

DETAILED DESCRIPTION OF A PREFERRED EMBODIMENT

Figure 1:
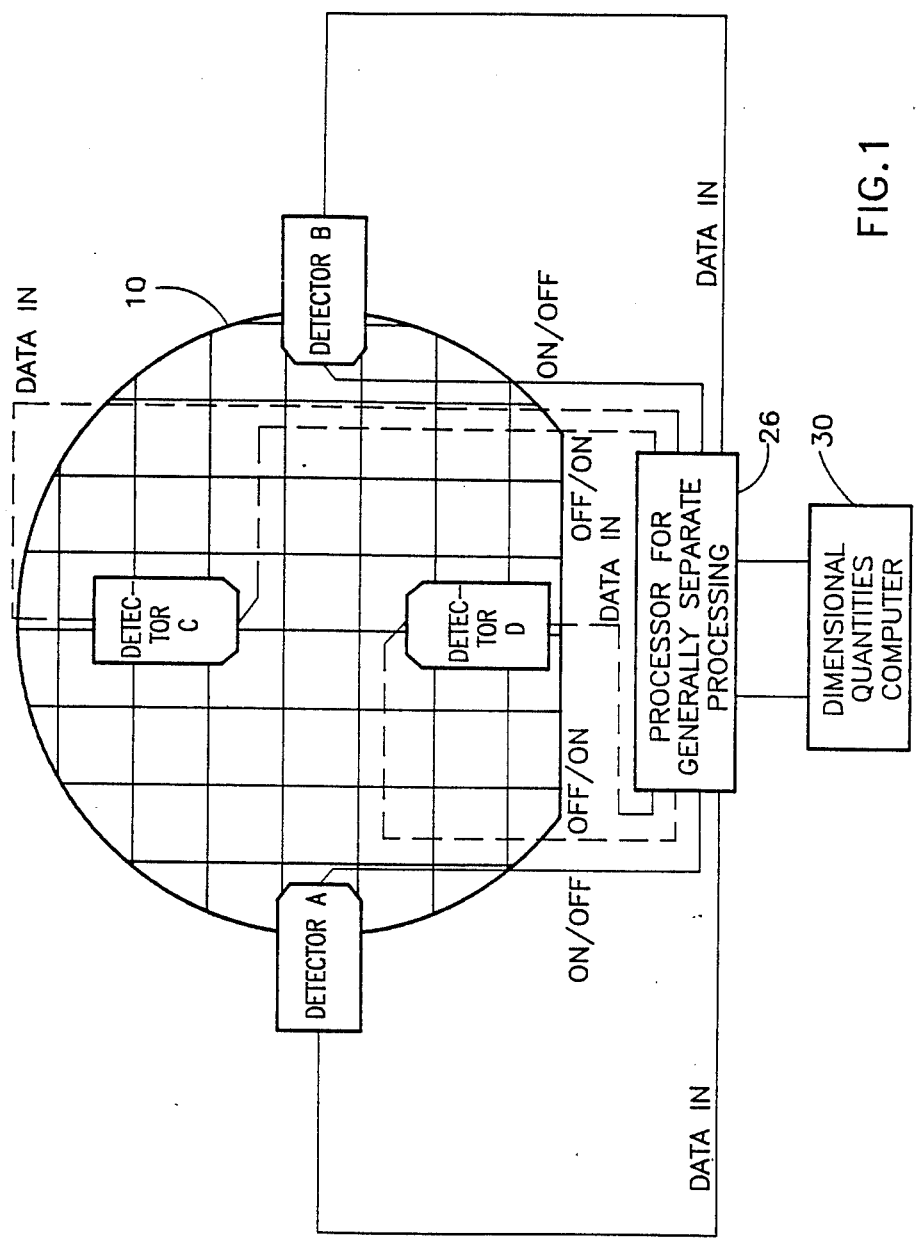
FIG. 1 is a schematic illustration of a preferred embodiment of the invention.
Figure 2:
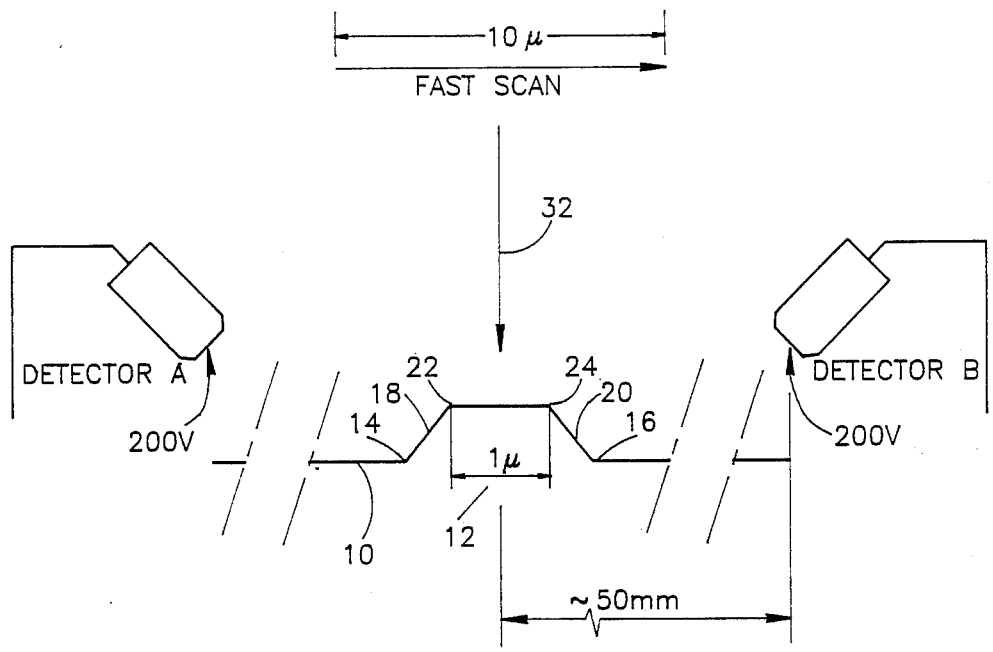
FIG. 2 is a pictorial illustration of a preferred mode of operation of the invention of FIG. 1.

Reference is made to FIGS. 1 and 2 which illustrate the apparatus of the preferred invention and a preferred mode of operation, respectively. Disposed around and above a specimen 10, typically a semiconductor wafer with topographical features disposed on it, are four electron detectors A, B, C and D, such as the Everhart-Thornley type, typically placed at the 90° points of a circle and typically arranged into two pairs of first and second detectors. According to FIG. 1, electron detectors A and B form one pair and electron detectors C and D form a second pair. A pair of electron detectors is typically arranged to be on either side of a topographical feature 12, shown in FIG. 2., which is typically 1 micron wide and typically comprises left and right juncture points 14 and 16, respectively, left and right top corners 22 and 24, respectively, and left and right middle points 18 and 20, respectively.

The electron detectors A, B, C and D are attached to a processor 26 for generally separate processing which processes two signals from an operative pair of electron detectors, either A and B or C and D, in a generally separate manner. The processor 26 then typically uses the processed signals to identify points 14–24 via a method described hereinbelow. Alternative embodiments of the present invention identify other types of topographical features.

The processor 26 produces feature information, typically points 14–24, for a dimensional quantities computer 30 which uses the feature information to calculate the important parameters of the feature 12, such as its width, if it is a resist line. For a feature 12 consisting of periodical group of lines and spaces, the computer 30 calculates an indication of the period length. Alternatively, for vias and contact holes, the diameter may be calculated or for overlay placement marks, the misregistration may be calculated.

During a scan of a primary electron beam 32, shown in FIG. 2, only one pair of electron detectors, A and B or C and D, is operative. This is shown in FIG. 1 by the off/on and on/off lines from the electron detectors A, B, C and D to the processor 26 and indicates that the processor 26 only receives data from one pair of electron detectors during a measurement. The operative pair is chosen by an operator and generally is determined by the direction of the feature 12 and the desired profile to be measured. For example, for a north-south resist line whose width is desired, electron detectors A and B would be chosen.

Exposing in-process wafer materials, such as conductors, semiconductors and insulators, to an electron beam 32 typically creates charging damage to the integrated circuit device as well as measurement skewness due to the charge. To minimize the exposure, the primary electron beam 32 has a low current, typically of a few picoamperes, is scanned quickly across the topographical feature 12, typically within much less than one second, and is only allowed to irradiate the specimen 10 in the area near the feature 12, typically within 10 micron of its presumed position. This is accomplished by having an operator, at set up time, optically align the wafer and by having accurate mechanical motion systems, described in Isreal Patent Application 88574 and incorporated herein by reference, move the wafer to the designated place during operation. The mechanical motion systems operate while the electron beam 32 is blanked out. It will be appreciated that it may be possible to automatically align the wafer.

It is a particular feature of the present invention that the electron beam 32 is scanned at a fast rate, typically 4 microseconds per detector signal sample. The fast scan rate reduces electron beam radiation as well as increases the immunity of the measurements of environmental interferences such as vibration. However, it also reduces the signal-to-noise ratio of the resulting measurement signal and thus, a processing method, described hereinbelow, was developed.

Figure 3:
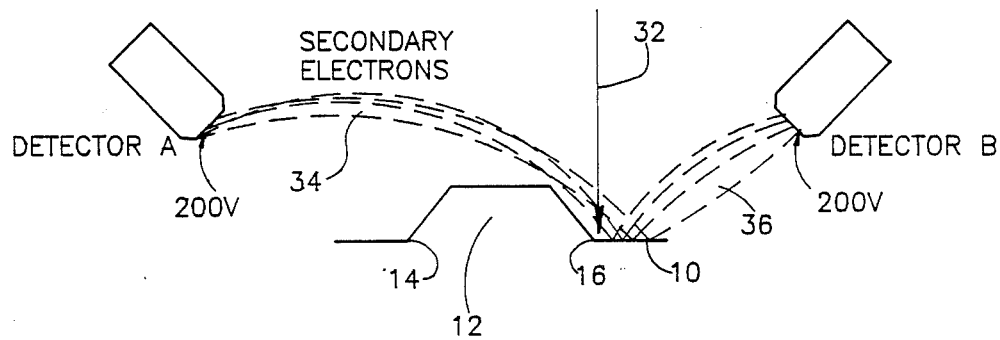
FIG. 3 is a pictorial illustation of the trajectories of electrons during a measurement scan of the apparatus of FIG. 1.

Before the electron beam 32 is scanned, the appropriate pair of electron detectors A and B, typically placed about 50 mm from the feature 12, are activated by charging their Faraday cages, typically to 200 V each. It will be noted that the change on the Faraday cages need not be equivalent; it simply must be constant during the measurement porcess. The changed Faraday cages attract secondary electrons emitted from the feature 12 as a result of the radiation of the electron beam 32, as shown in FIG. 3.

When the electron beam 32 irradiates the surface of specimen 10, the surface emits secondary electrons 34 and 36 which are simultaneously attracted to the electron detectors A and B, respectively. When the electron beam 32 impinges upon the right side of the feature 12, more secondary electrons 36 will arrive at electron detector B than at electron detector A, thus providing a stronger signal to electron detector B. When the electron beam 32 impinges upon the left side of the feature, the opposite will be true and electron detector A will produce a stronger signal. It will be appreciated that employment of a low-voltage electron beam 32, ensures that the entirety of secondary electrons emerge from a narrower area than that due to a high-voltage beam and thus, produces a better signal for measurement purposes.

Figure 4:
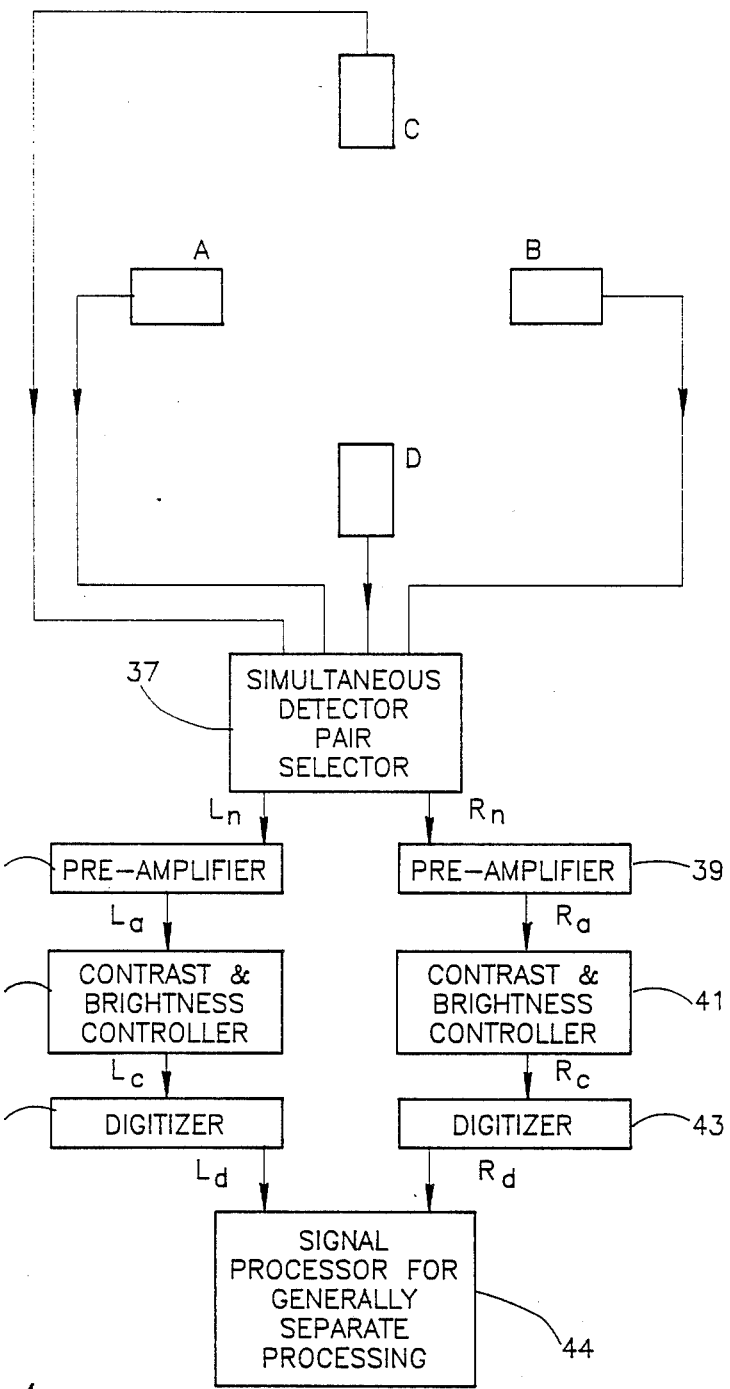
FIG. 4 is a schematic illustration of a preferred embodiment of the operation of apparatus of FIG. 1.

Reference is now made to FIG. 4 which shows, in block diagram form, the processing which occurs in processor 26. The four detectors A, B, C and D are connected to a simultaneous detector pair selector 37 which selects, based upon operator input, the pair of electron detectors to be activated for a particular measurement. It will be appreciated that any first and second detector set, such as a left and right detector set, may be used. After detector selection, the electron beam 32 is quickly scanned across the feature 12, simultaneously producing two typically noisy signals $L_n$ and $R_n$, one from each electron detector.

The two noisy signals $L_n$ and $R_n$ are sent to individual pre-amplifiers 38 and 39 producing signals $L_a$ and $R_a$ which subsequently undergo brightness and contrast modification by contrast and brightness controllers 40 and 41. The two resultant high contrast signals $L_c$ and $R_c$ are subsequently digitized by digitizers 42 and 43, such as an A/D converter, to produce two digitizer high contrast noisy signals $L_d$ and $R_d$ which are then separately stored in a signal processor 44 for generally separate processing.

The electron beam 32 is scanned N times across the feature 12, where N is typically 64, and 2N digitized signals are separately stored in signal processor 44. The signal processor 44 generally separately processes the 2N signals it received from the two detectors, as described hereinbelow, creating one signal per detector, with the noise caused by the fast scanning process substantially reduced.

Figure 5:
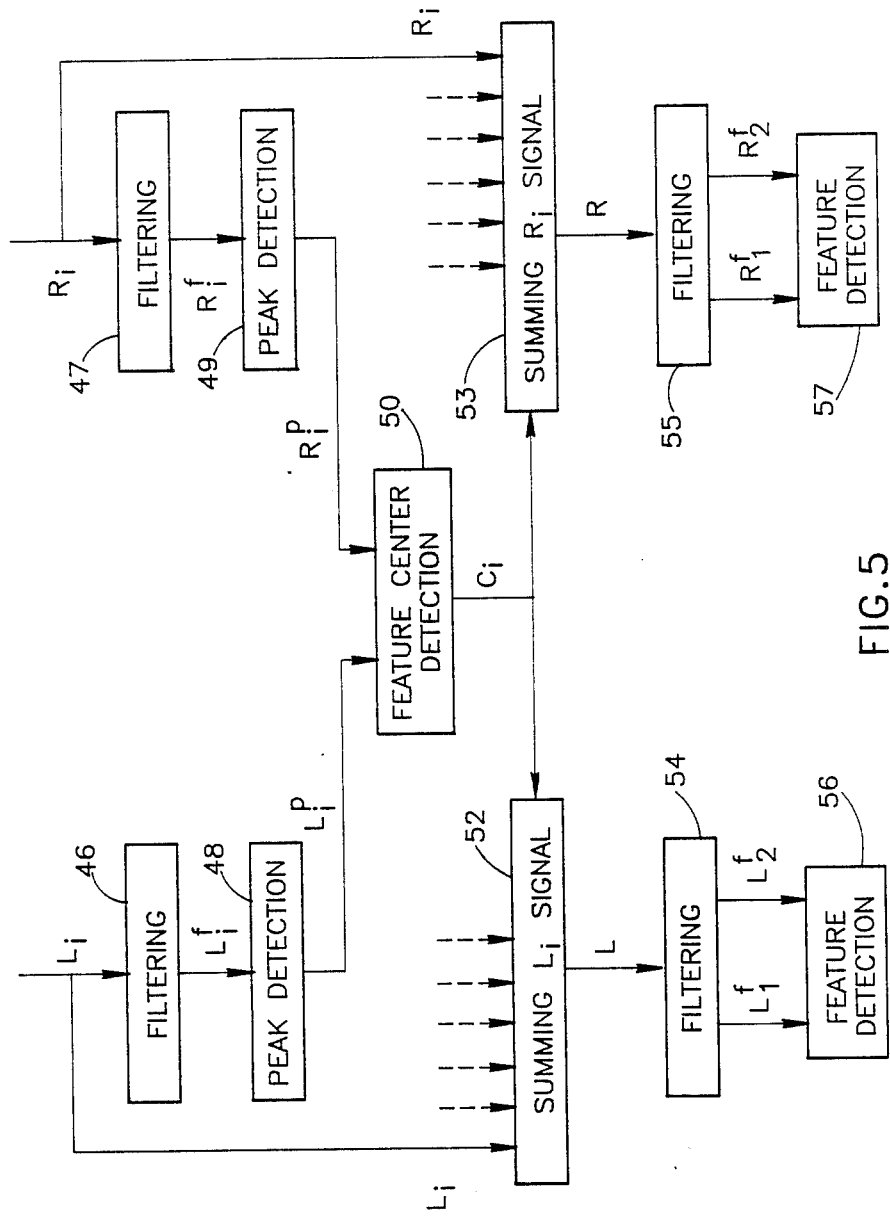
FIG. 5 is a flowchart illustration of the operation of FIG. 4.

Reference is now made to FIG. 5 which outlines the signal processing method. The 2N noisy, digitized signals $L_i$ and $R_i$ respectively received, after the processing illustrated in FIG. 4, from the right and left electron detectors A and B or C and D, are generally processed separately. In steps 46 and 47, $L_i$ and $R_i$, respectively, are filtered, via an averaging technique which both edge enhances and smoothes, to produce less noisy signals $L_i^f$ and $R_i^f$ with well-defined peaks and valleys.

The locations $L_i^p$ and $R_i^p$ of the well-defined peaks are found in steps 48 and 49, respectively, and in step 50, the location of the center of the feature is found for each of the N signal pairs $L_i$ and $R_i$ according to the relationship:

$$C_i = L_i^p + (R_i^p - L_i^p)/2 \qquad (1)$$

The center location is marked on the first original noisy signal pair $L_1$ and $R_1$ and the remaining $N-1$ signals are shifted such that their center location $C_i$ is aligned with $C_1$ of the first signal pair. Thus, errors due to vibration of the wafer during the N scans is eliminated. It will be appreciated that the centering process described hereinabove in steps 46 through 50 is optional; however, it has been found to improve results. Should it not be used, the 2N original noisy signals $L_i$ and $R_i$ being processing at steps 52 and 53 described hereinbelow.

The N original left signals $L_i$, aligned or otherwise, are summed together, in step 52, to produce a signal L with substantially reduced noise components representing a scan of the electron beam 32 as detected at the left detector.

The N original right signals $R_i$, aligned or otherwise, are summed together, in step 53, to produce a signal R with substantially reduced noise components representing a scan of the electron beam 32 as detected at the right detector.

In steps 54 and 55, the signals L and R are filtered twice, via the a similar technique to that of steps 46 and 47, to produce two signals with very well defined peaks and valleys that indicate the junction point 14 or 16, the middle point 18 or 20 and the top corner point 22 or 24. It is a feature of the invention that the top, middle and bottom points of the feature are identified.

Figure 6A:
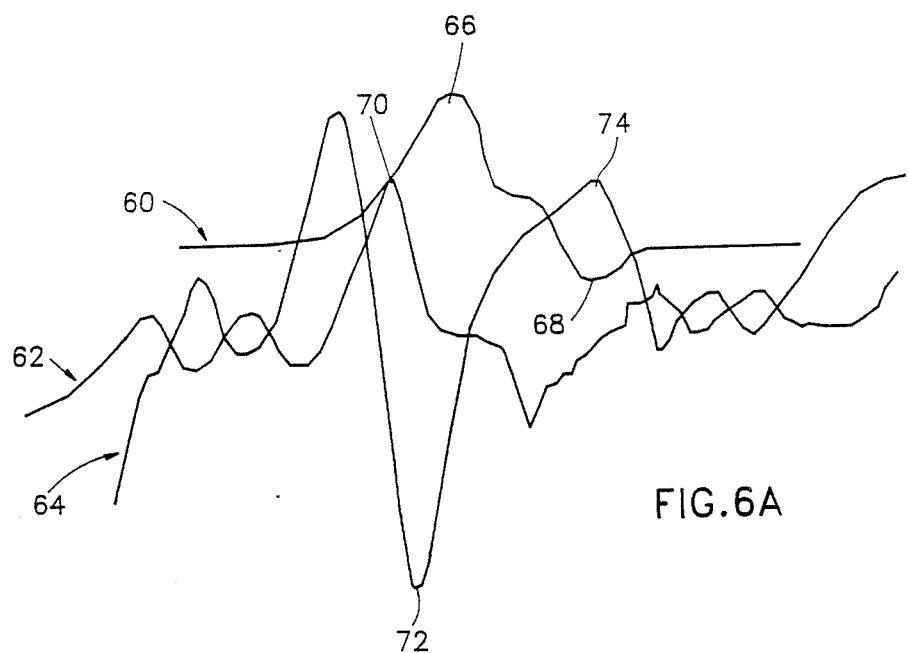
FIG. 6A is an idealized illustration of a first signal waveform resulting from a protruding topographical feature and various signal waveforms resulting from the operations indicated in FIG. 5 on the first waveform.

FIG. 6A illustrates, in an idealized manner, the signals produced from, for example, detector A. A signal, referenced 60, is a typical output of step 52 and the two filtered signals, referenced 62 and 64, repsectively, are typical outputs of step 54 given signal 60. The signal 60 has a high area 66 and a dip 68 which roughly indicate the positions of the top corner 22 and the opposite junction point 16, respectively. First filtered signal 62 has a number of peaks, the largest and sharpest one 70 indicates the middle point 18. The second filtered signal 64 has a large minimum 72, indicating the top corner 22, and a maximum 74 shortly thereafter indicating the opposite junction point 16.

In step 56, the above-mentioned maxima and minima 70–74 are identified. In step 57, similar maxima and minima of the signal from the left detector, representing important elements of the feature, are identified.

The above-mentioned elements are sent to the dimensional quantities computer 30 whcih then combines the partial information about the feature 12 produced from the two signal processors 26 and 28 to produce dimensional data.

Figure 6B:
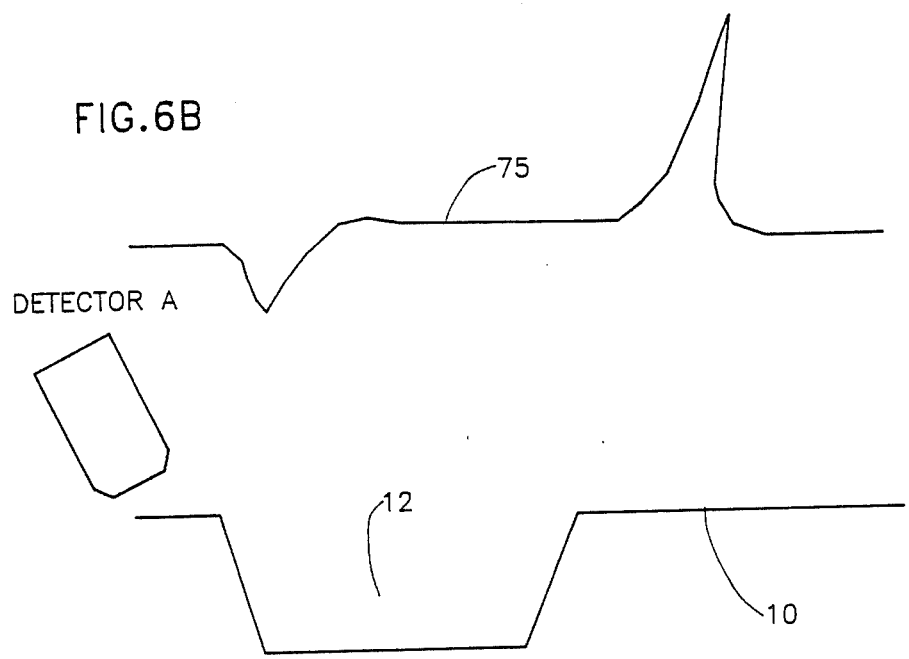
FIG. 6B is an idealized illustration of a signal waveform resulting from a recessed topographical feature.

It is a feature of the invention that the dimensional quantities computer 30 typically can automaticlaly identify, from one processed signal alone, that the topographical feature 12 is a resist line (i.e. it protrudes from the specimen 10) or a space (i.e. it is recessed within the specimen 10). FIG. 6A illustrates the signal typically produced by left detector A for a resist line, or similar type of protrusion. As mentioned above, the signal 60 has a pronounced peak and a valley which indicate the top of the resist line and its opposite bottom. FIG. 6B illustrates a signal 75 produced by left detector A for a space. The pronounced peak and vally are still present; however, they have switched positions. Thus, by analyzing the signal 60 or 75 with respect to the detector which produced it, the system of the present application can automatically identify what type of feature 12 is being measured.

The dimensional quantities computer 30 additionally is used for calibration of the signals. A number of fast scans are performed on a specimen whose feature dimensions are very accurately known. The width of the feature is calculated in number of signal sample points and is compared to the actual line width, thus producing the desired relationship between number of signal sample points and microns. A typical relationship is 400 sample points per micron.

Reference is now made to FIG. 7 which illustrates the data flow in a preferred embodiment of the invention. An 8-bit detector selector 76, controlled by computer signal processor 94, selects the appropriate detectors A and B or C and D, respectively, and feeds the signal into the brightness and contrast controllers 78 and 80. The analog outputs of the switches 82 and 84 are then enhanced by the brightness and contrast controllers 78 and 80 and digitized by A/D converters 86 and 88, producing 8-bit digital signals. The two 8-bit signals are merged into 16-bit signals via an I/O port 90 of a DMA controller 92 and buffered through the controller 92 to a microcomputer 94 for generally separate processing.

It will be appreciated by persons skilled in the art that the present invention is not limited by what has been particularly shown and described hereinabove. Rather the scope of the present invention is defined only by the claims which follow.

We claim:

1. A system for measuring a topographical feature on a specimen comprising:
    means for scanning an electron beam across a topographical feature at high speed;
    at least first and scond electron detector means organized in pairs;
    means for signal processing of a first signal received from said first electron detector means thereby to identify elements of across-sectional profile of said feature;
    means for signal processing of a second signal received from said second electron detector means generally separately from the signal processing of said first signal thereby to identify elements of a cross-sectional profile of said feature;
    means for incorporating said elements identified from said first electron detector means and said elements identified from said second electron detector means thereby to produce a composite picture of said feature.

2. A system according to claim 1 and wherein said scanning means scan said feature a predetermined number of times.

3. A system according to claim 1 and wherein said high speed is 4 microseconds per signal sample.

4. A system according to claim 1 and wherein said scanning means scan said specimen only in the area around said feature.

5. A system according to claim 2 and wherein said first and second electron detector means are organized into two detector pairs.

6. A system according to claim 5 and wherein of the said two detector pairs only one pair is operative during said predetermined number of scans.

7. A system according to claim 6 and wherein said operative detector pair detect electrons simultaneously during a single scan.

8. A system according to claim 2 and wherein said means for signal processing include a signal processing method which includes the steps of:
    filtering noisy signals received from each electron detector of said operative electron detector pair during said fast scan of said electron beam thereby to smooth the signals and to enhance contrasts;
    centering said noisy signals by generally detecting the center location of a topographical feature;
    summing together said predetermined number of said centered noisy signals from said first electron detector;
    summing together said predetermined number of said centered noisy signals from said second electron detector;
    twice repeating said filtering step on the results of said summing steps; and
    detecting significant features of said topographical feature from the results of said repeating step.

9. A system according to claim 2 and wherein said means for signal processing include a signal processing method which includes the steps of:
    summing together said predetermined number of noisy signals from said first electron detector;
    summing together said predetermined number of noisy signals from said second electron detector; and
    detecting significant features of a topographical feature from the results of said summing steps.

10. A system according to claim 1 and wherein dimensional quantities of said topographical feature, or features, are calculated from said significant features extracted, via said signal processing method, from said signals received from said first and second electron detectors of said detector pair.

11. A system according to claim 10 and wherein said significant features are the top, middle and bottom of a resist line.

12. A system according to claim 10 and wherein said dimensional quantities computer can automatically identify if said topographical feature is a protrusion or is recessed into said specimen.

* * * * *